United States Patent [19]

Hermann

[11] 4,126,802
[45] Nov. 21, 1978

[54] TORSIONAL MODE CT OR DT CUT QUARTZ RESONATOR

[75] Inventor: Jean Hermann, Neuchatel, Switzerland

[73] Assignee: Centre Electronique Horloger, S.A., Neuchatel, Switzerland

[21] Appl. No.: 758,557

[22] Filed: Jan. 11, 1977

[30] Foreign Application Priority Data

Jan. 16, 1976 [CH] Switzerland ............... 486/76

[51] Int. Cl.² .................................... H01L 41/10
[52] U.S. Cl. .................................... 310/361; 310/368; 310/370
[58] Field of Search ............... 310/361, 368, 370, 333

[56] References Cited
U.S. PATENT DOCUMENTS

| | | | |
|---|---|---|---|
| 1,874,960 | 8/1932 | Giebe et al. | 310/333 |
| 2,227,904 | 1/1941 | Hight | 310/361 X |
| 3,128,397 | 4/1964 | Shinoda et al. | 310/361 |
| 3,483,402 | 12/1969 | Royer | 310/361 X |
| 3,497,732 | 2/1970 | Royer | 310/361 |

Primary Examiner—Mark O. Budd
Attorney, Agent, or Firm—Cushman, Darby & Cushman

[57] ABSTRACT

The invention relates to piezoelectric resonators, and more particularly to piezoelectric resonators comprising a DT- or CT-cut quartz plate vibrating torsionally about its longitudinal axis which is the electrical axis X of the quartz crystal. The width of the plate $b$, extending along the Z'-axis, and its thickness $h$ extending along the Y'-axis are linked by the relation $$1 < b/h < 10$$

In proportion to its size, the resonator has a low resonance frequency, the temperature coefficient of the first order of which is nil and the temperature coefficient of the second order of which is very low.

7 Claims, 8 Drawing Figures

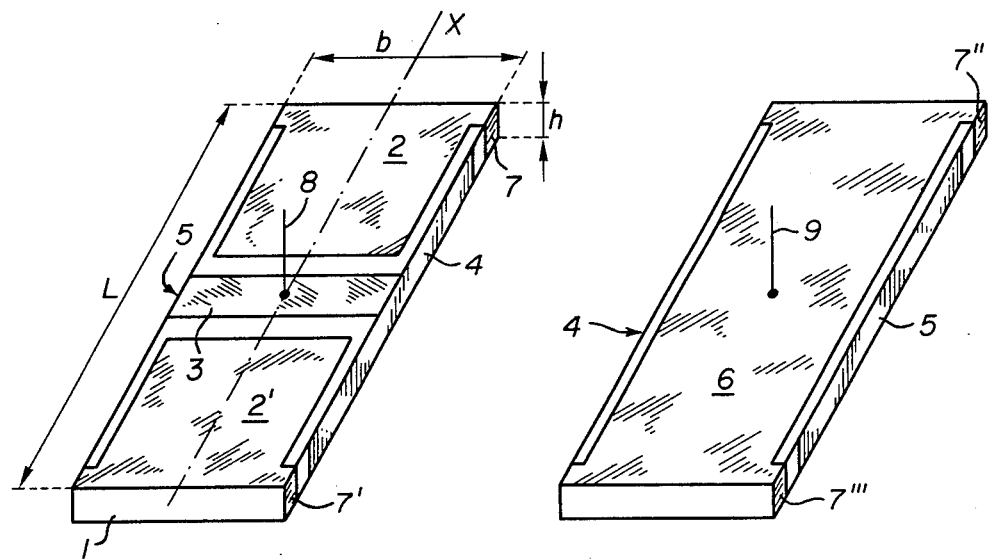
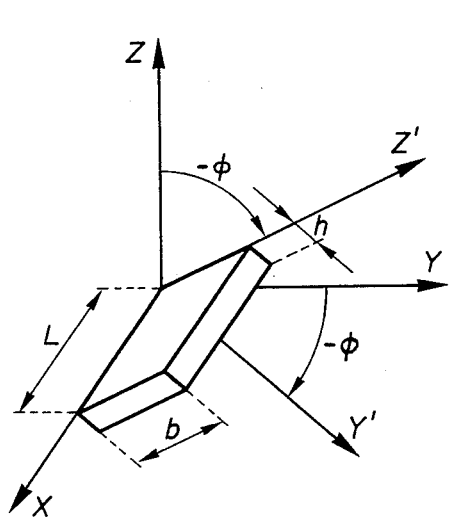
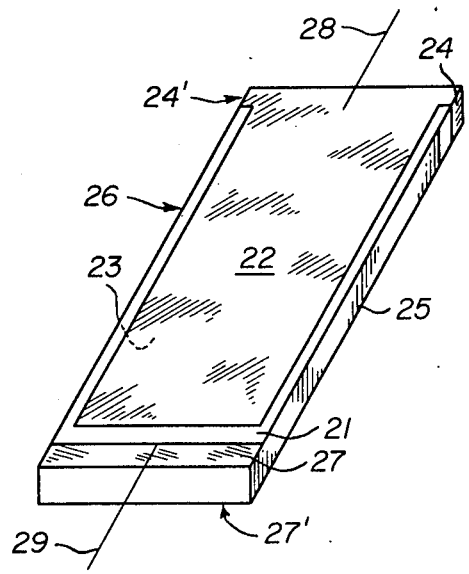

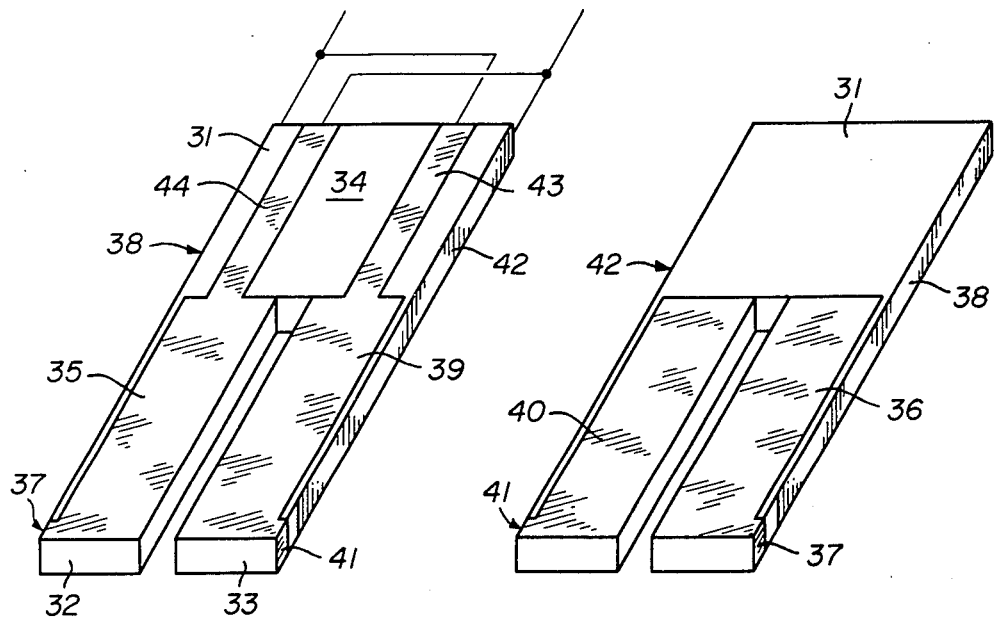
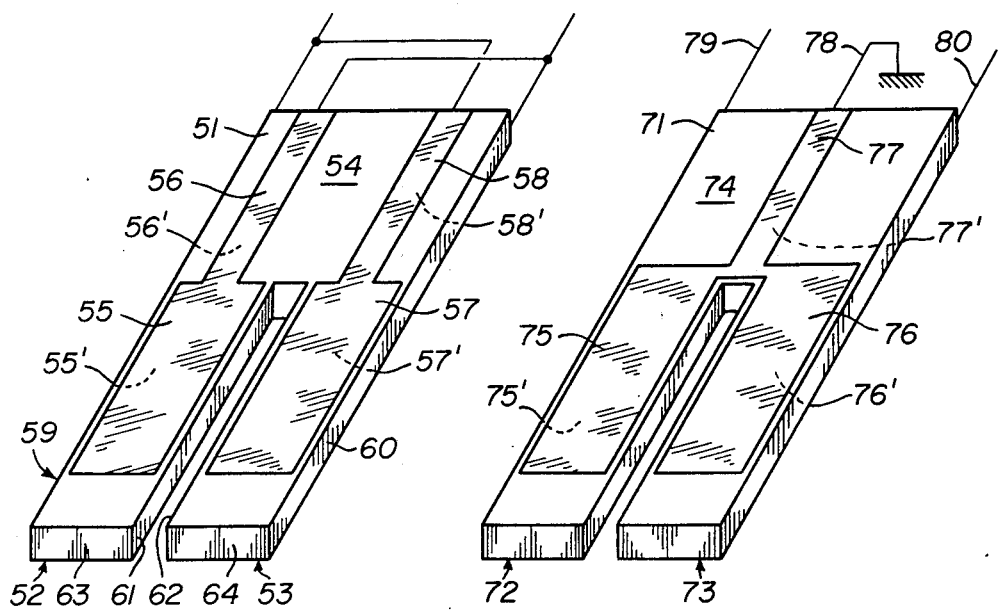

TORSIONAL MODE CT OR DT CUT QUARTZ RESONATOR

The present invention relates to a piezoelectric resonator comprising at least one quartz crystal plate or bar in the form of a rectangular parallelepiped, vibrating torsionally around its longitudinal axis. Such a resonator is utilisable particularly in electronic wrist-watches, but also in other fields than watch-making, f.i. in miniaturized oscillator circuits or in wave filters.

Resonators of this type are already known, in particular from the works of E. GIEBE and E. Blechschmidt published in the journal "Hochfrequenztechnik und Elektroakustik," volume 56, 1940, Nr. 3, pp. 65–87, under the title: "Ueber Drillungsschwingungen von Quarzstäben und ihre Benützung für Frequenznormale." The resonators described in this article are formed by quartz bars the length of which is directed along the electrical axis X and the other dimensions along the mechanical axis Y and the optical axis Z, respectively. In this case the resonators are not rotated in respect to their cristallographic axes. Optimisation of their thermal properties, i.e. annulment of the temperature coefficient of the first order of the resonance frequency, is obtained by a judicious choice of the proportions of the cross-section, the thickness to width ratio being substantially unity.

Such resonators present the drawback that their thermal properties depend very critically on the thickness to width ratio. Due to this fact, difficulties are encountered in the mass production thereof. On the other hand, the temperature coefficient of the second order of the resonance frequency of these resonators is relatively high.

Another drawback of these resonators is the fact that their resonance frequency is relatively high in proportion to the required space, which is not desirable in certain applications, particularly in watch-making.

A principal object of the invention is to avoid these different drawbacks and to provide a resonator of the above-mentioned type for which a single constraint is predominant, the frequency of which is relatively low inspite of a reduced required space, the temperature coefficient of the first order of the frequency of which is annuled and the temperature coefficient of the second order of which is very low.

With this object in view, the resonator according to the invention is characterized in that the quartz crystal plate is a DT- or CT-cut plate and in that the length L of the plate, in the direction of the electrical axis X of the crystal, its width $b < L$ along the Z'-axis, and its thickness $h$ along the Y'-axis, are linked by the relation $$1 < b/h < 10.$$

In a preferred embodiment, the dimensions of the cross-section of the plate are linked by the relation $1.5 < b/h < 5$. This relation appears to provide an optimum between on the one hand a quite strong piezoelectric coupling, due to the indicated upper limit, and on the other hand, due to the indicated lower limit, a not too high resonance frequency for a given volume and a not too critical dependancy of the thermal properties on the thickness to width ratio.

The DT- and CT-cut plates are generally utilised for resonators which work in the face-shear mode and correspond to a rotation of the Y'- and Z'-axes of the plate with respect to the mechanical axis Y and the optical axis Z around the electrical axis X of the quartz, so that the temperature coefficient of the first order of the frequency becomes nil. Depending on the authors of the relevant publications in the art, slightly different values are given for the angle of rotation for which this condition is fulfilled, so that the DT- and CT-cut crystals each correspond to a small range of angles of rotation very close to about −52° and 38°, respectively.

In a preferred embodiment, the quartz crystal utilised is a DT-cut plate, which allows a particularly low temperature coefficient of the second order of the frequency to be obtained.

It is to be noted with respect to the foregoing explanations, that the DT- or CT-cut plates employed in the shear mode resonators are not exactly those which give the best thermal behaviour in the torsion mode, because of effects of the second order.

The accompanying drawing represents, by way of example, different embodiments of the resonator according to the invention.

FIGS. 1A and 1B respectively represent a view from above and a view from below of a plate-shaped resonator vibrating torsionally about the X-axis.

FIG. 1C shows the orientation of the quartz crystal plate used in the invention.

FIG. 2 represents a quartz resonator similar to that of FIGS. 1A and 1B in which the electrodes are arranged symmetrically.

FIGS. 3A and 3B respectively represent a view from above and a view from below of a resonator in the form of a torsional tuning fork comprising two quartz plates such as that employed in the resonator of FIGS. 1A and 1B.

FIG. 4 illustrates a torsional tuning fork similar to that of FIGS. 3A and 3B, but comprising symmetrically arranged electrodes; and FIG. 5 illustrates a torsional tuning fork similar to that of FIGS. 3A, 3B and 4, but the electrodes of which constitute a tripole.

FIGS. 1A and 1B represent a resonator comprising a DT-cut quartz crystal plate 1, having the shape of a rectangular parallelepiped, of length L extending along the longitudinal axis X, of width $b$ and of thickness $h$. FIG. 1A shows the top face of the plate which is metallized over the major portion of its surface. This face comprises an electrode divided into two zones 2 and 2', separated by a zone comprising a metallized transverse strip. The latter connects electrodes 4 and 5 covering the small longitudinal faces of the plate 1. The bottom face of the plate 1, showed in FIG. 1B, carries an electrode 6 which is connected to the zones 2 and 2' of the electrode of the top face by means of the lateral strips 7, 7', 7'' and 7'''. Two connecting wires 8 and 9 are preferably soldered perpendicularly to the large faces of the quartz crystal plate 1 at points situated at least approximately in the middle of the transversal metallized strip 3 and of the electrode 6.

FIG. 1C shows the orientation of the principal directions of the quartz plate used in the invention, with respect to the axes of the crystal from which it has been cut. X, Y and Z are respectively the electrical, the mechanical and the optical axes of the crystal; the principal directions X, Y' and Z' of the plate are, respectively, parallel to the directions of the length L, of the thickness $h$ and of the width $b$ of the plate. As shown in FIG. 1C the plate is rotated about the X-axis, the directions of Y' and Z' forming an angle $\phi$ respectively with the Y and Z axes. For a DT-cut plate, the angle of cut φ has a value lying between −51° and −57°. For a CT-cut plate the value of the angle of cut lies between 33° and 39° (see also "Standards on Piezoelectric crystals 1949" Proc. of the IRE, Vol. 37. No. 12, Dec. 1949, pp. 1378-1395).

FIG. 2 represents a variant of the resonator according to FIGS. 1A and 1B comprising a quartz plate 21 similar to the plate 1. The large top and bottom faces respectively support electrodes 22 and 23 connected to each other by means of lateral metallized strips 24 and 24'. The small longitudinal faces are also metallized to form electrodes 25 and 26 connected together by a metallized strip 27, arranged transversally at one end of the large surface of the bar carrying electrode 22. A strip 27' identical to the transverse strip 27 may be disposed at one end of the large face of the bar carrying electrode 23. In this case, due to the symmetry of the electrodes on the large top and bottom faces of the plate, a single and same mask allows metallization of the faces of the plate to be achieved The connecting wires 28 and 29 are fixed, f.i. soldered, tangentially respectively to the electrode 22 and to the transverse strip 27. Due to this arrangement, the fixing points are practically not subjected to any constraint when the resonator undergoes torsional vibration around its longitudinal axis. On the other hand, the connecting wires undergo rotations. It is to be noted that in the example described in FIGS. 1A and 1B, the reverse effect occurs, i.e. that the soldered points are subjected to relatively important constraints; the connecting wires, on the other hand, do not undergo any rotation in that case.

By way of example, a resonator of this type having the following dimensions, length L=5.60 mm, width b=1.00 mm, thickness h=0.24 mm, oscillates with a resonance frequency of 131.072 kHz or $2^{17}$ Hz, readily usable in watch-making.

A plate-shaped torsional resonator presents a certain analogy with a plate vibrating in a flexural mode. As a matter of fact, in both cases, the movement of the particles is transversal, i.e. perpendicular to the direction of wave propagation, and the frequency is relatively low due to an important rotation effect. This analogy extends to the fact that for torsion as for flexion, one can pair two bars to obtain a resonator in the form of a tuning fork. This variant, constituting a "torsional tuning fork" affords the advantage of permitting fixation by embedding in a rigid support, practically exempt of vibrations, which avoids employing thin suspension wires, and consequently simplifies the manufacturing operations and permits the resistance to mechanical shocks to be increased. Different examples of embodiments of such tuning forks will be described in detail below.

With reference to FIGS. 3A and 3B, a quartz crystal plate 31 comprises two bars 32 and 33 disposed side by side in parallel relationship in the longitudinal direction and connected by one of their ends to a common base part 34. The two major faces of the bar 32 are respectively provided with electrodes 35 and 36 connected together by means of a metallized strip 37 disposed at one end of the small longitudinal face 38 of the quartz plate 31. Similarly, the two large faces of the bar 33 comprise electrodes 39 and 40 connected together by means of a metallic strip 41, disposed at one end of the small longitudinal face 42 of the quartz 31.

The small longitudinal faces 38 and 42 of the quartz plate 31 are further metallized on a major portion of their surface to form electrodes thereon. The electrode of face 38 is connected to a longitudinal strip 43 which prolongs the electrode 39 of the bar 33, while the electrode of face 42 is connected to a longitudinal strip 44 which prolongs the electrode 35 of the bar 32.

The electrodes 35, 36 of one part and 39, 40 of the other part are respectively connected to the electrodes of the small longitudinal faces 42 and 38 of the quartz plate by external connections indicated schematically on FIG. 3A and constituting the two poles of this bipolar resonator.

FIG. 4 illustrates another embodiment of the resonator of the invention comprising a quartz plate 51 of the same shape and the same angle of cut as the quartz plate 31 of FIGS. 3A and 3B. This quartz plate 51 comprises two bars 52 and 53 disposed in parallel relationship side by side in the longitudinal direction and rigidly fixed to a common base part 54. The large parallel faces of the bar 52 carry electrodes 55 and 55' of the same shape, which are arranged symmetrically with respect to the medium plane of the bar 52 parallel to the large faces thereof, and are connected to each other by means of two metallized strips 56 and 56' which respectively prolong electrodes 55 and 55' in the longitudinal direction up to the free end of the base part 54 and which rejoin each other on the transverse free face of this base part. On the other hand, the small longitudinal faces of the quartz plate 51 are metallized on their whole surface to respectively form the electrodes 59 and 60, and the small longitudinal faces of the bars 52 and 53, parallel to each other and to the small longitudinal faces of the quartz plate 51, are provided with electrodes 61 and 62 which entirely cover the said faces. The electrodes 59 and 61 are connected together by a metallized part 63 which covers the transverse face of the bar 52. In an analogous way, the electrodes 60 and 62 are connected together by a metallized part 64 which covers the transverse face of the bar 53.

The electrode 60 is further connected to the electrodes 55 and 54' by means of the longitudinal strips 56 and 56' and of an external connection. The electrode 59 is similarly connected to the electrodes 57 and 57' by means of the longitudinal strips 58 and 58' and of an external connection. The embodiment according to FIG. 4 which comprises symmetrical metallizations on the large faces of the quartz and metallizations on the whole surface of the lateral faces concerned, constitutes an important advantage in carrying out the metallizations in large manufacturing series.

FIG. 5 illustrates an embodiment of the tuning fork resonator which is of particular interest with regard to its electrical properties. A quartz plate 71 similar to that of FIGS. 3A, 3B and 4, comprises two bars and a common base part designated respectively by 72, 73 and 74. The metallization of the small faces of the plate 71 and of the bars 72 and 73 is identical to that of the same faces in the example of FIG. 4. The large faces of the bars 72 and 73 carry electrodes 75, 75' and 76, 76', which are arranged symmetrically with respect to the two planes of symmetry of the plate, and which are connected together by metallized parts 77 and 77' on each of the large faces of the base part 74. The electrodes of the large surfaces of the quartz plate are connected to ground by an external connection 78, while the electrodes formed on the small faces of each of the two bars are provided with respective connecting wires 79 and 60 which constitute two other connections of the resonator, the same thus forming a tripole.

In the arrangement of the electrodes according to FIG. 5 the static capacity of the resonator is reduced to a minimum by the shielding effect resulting from the presence of the electrodes connected to ground on the large surfaces of the bars. Thus an optimum ratio between the dynamic and static capacitances of the resonator, i.e. maximum piezoelectric coupling, is achieved. As a matter of fact, the ratio between these capacitances is approximately situated between $10^{-3}$ and $10^{-4}$ for a tuning fork such as shown in FIGS. 3A, 3B and 4 and between $10^{-2}$ and $10^{-3}$ for a tuning fork of the type illustrated in FIG. 5.

A practical example illustrates the advantage obtained by the present tuning fork resonator with respect to the resonators vibrating in flexion as currently employed in the watch-making industry. For instance, a quartz resonator formed by two bars of a cross section of 0.5 mm × 0.12 mm and of a length of 2.6 mm, spaced at a distance of 0.2 mm and a base part of a length of about 2 to 2.5 mm, presents a resonance frequency of 131.072 kHz, i.e. $2^{17}$ Hz, which is particularly useful in the field of watch-making.

By comparison with a quartz resonator of the flexion type, the present torsional resonator with a DT-cut quartz crystal plate achieves an improvement of the quadratic temperature coefficient by a factor of 2 to 3.

By comparison with DT-cut quartz resonators working in a face-shear mode, the thermal behaviour is similar. On the other hand, the present resonator achieves a considerable gain in the following respects: for an equal required space, a three times lower frequency is obtained; for an equal surface, a frequency 6 to 8 times lower is obtained; and, for an equal frequency, the largest dimension is 3 times and the surface 40 to 60 times smaller.

With regard to the arrangement of the electrodes, the ideal solution from the point of view of piezoelectric coupling is a metallization on the four faces of the plate. In order to simplify manufacture, one may renounce metallizing one of the small faces of the quartz crystal plate and in particular, in the case of tuning forks, one may not metallize the small faces of the bars which are situated facing one another (see FIGS. 3A and 3B). To simplify a plate shaped resonator, one may envisage only metallizing the major surfaces and utilizing the walls of the resonator housing to constitute the electrodes for the small faces. However, for electrical reasons, these walls must then be located at as small a distance as possible from the faces of the plate. This condition might render mass production difficult. On the other hand, such a solution would permit metallization of entire quartz plaquettes which could be cut up subsequently, i.e. after the electrodes have been formed, the plates thus obtained being ready for use without necessitating any manipulation as far as the metallization is concerned.

What is claimed is:

1. A piezoelectric resonator comprising at least one quartz plate or bar having the shape of a rectangular parallelepiped, vibrating torsionally about its longitudinal axis, wherein the quartz plate is a DT- or CT-cut plate the length L of which, extending along the electrical axis X of the crystal, the width $b$ of which extending along the Z'-axis, and the thickness $h$ of which, extending along the Y'-axis, are linked by the relations $$1 < b/h < 10, b < L.$$

2. A resonator according to claim 1 using a DT-cut quartz crystal plate, the cutting angle $\phi$ of which is comprised between $-51°$ and $-57°$, this angle $\phi$ being defined by the axes Y, Y' on the one hand and Z, Z' on the other hand, where Y and Z are the mechanical and optical axes of the quartz crystal and Y' and Z' are the principal directions of the plate extending respectively parallelly to the thickness and to the width of this plate.

3. A resonator according to claim 1, in which the dimensions of the cross-section of the plate are linked by the relation $$1.5 < b/h < 5.$$

4. A resonator according to claim 1 wherein the quartz crystal plate comprises two elements in the form of bars arranged in parallel in the longitudinal direction, and a base part common to the two bars so as to form a tuning fork.

5. A resonator according to claim 4, wherein each of the bars comprises a first electrode covering at least approximately one of the major faces of the bar, this electrode being connected by means of a metallized strip disposed on the adjacent small longitudinal face of the plate, to a second electrode covering at least approximately the major face parallel to the preceding one, wherein the said first electrodes of the two bars comprise, in the longitudinal direction, a metallized strip which prolongs these electrodes up to the end of the base part, and each of the small longitudinal faces of the plate comprises an electrode connected to the longitudinal metallized strip prolonging the electrode of the major face of the bar which is not adjacent to this electrode.

6. A resonator according to claim 4, wherein each of the bars comprises on each of its major faces an electrode covering at least a major portion of this face, the parallel electrodes of each pair being connected together by means of metallized longitudinal strips which prolong these electrodes up to the end of the base part of the quartz, wherein each small longitudinal face of the plate comprises an electrode connected to an electrode covering the parallel face of the bar adjacent to the said small face by means of a metallized strip covering the transverse face of this bar, and wherein the electrode covering one of the small longitudinal faces of the plate is connected to the electrodes covering the major faces of the bar which are not adjacent to this electrode.

7. A resonator according to claim 4, wherein each of the bars comprises on each of its major faces an electrode covering at least a major portion of this face, these electrodes being all connected together by means of a longitudinal metallized strip which prolongs these electrodes up to the end of the base part of the plate, and being connected to ground, and wherein each small longitudinal face of the plate comprises an electrode connected to an electrode covering the face parallel to the bar adjacent to the said small face by means of a metallized strip covering the transverse face of this bar.

* * * * *